United States Patent [19]

Hughes

[11] Patent Number: 5,059,832
[45] Date of Patent: Oct. 22, 1991

[54] SWITCHED CURRENT INTEGRATOR CIRCUIT

[75] Inventor: John B. Hughes, Hove, England

[73] Assignee: U.S. Philips Corporation, New York, N.Y.

[21] Appl. No.: 520,683

[22] Filed: May 8, 1990

[30] Foreign Application Priority Data

May 10, 1989 [GB] United Kingdom ............... 8910755

[51] Int. Cl.$^5$ .............................................. G06G 7/12
[52] U.S. Cl. .................................. 307/490; 307/353; 323/316
[58] Field of Search ............... 307/490, 353; 328/151, 328/127; 323/316–317, 315

[56] References Cited

U.S. PATENT DOCUMENTS

| | | | |
|---|---|---|---|
| 4,806,880 | 2/1989 | Laws | 328/127 |
| 4,864,217 | 9/1989 | Bird | 323/316 |
| 4,866,368 | 9/1989 | Bird | 323/316 |
| 4,897,596 | 1/1990 | Hughes | 323/316 |
| 4,958,123 | 9/1990 | Hughes | 323/316 |

Primary Examiner—Stanley D. Miller
Assistant Examiner—Andrew Sanders
Attorney, Agent, or Firm—Bernard Franzblau

[57] ABSTRACT

A switched current integrator circuit consists of a feed-forward input (32) which is connected to the input of a first current memory cell (T31, T32, S31, C31) during a portion $\phi 1$ of each sampling period and to the input of a second current memory cell (T33, T34, S32, C32) during a portion $\phi 2$ of each sampling period. The signal to be integrated is fed to a second input (31) connected to the input (T33) of the second current memory cell and to the output (T32) of the first current memory cell. A first output (T34) of the second current memory cell is fed back to the input (T31) of the first current memory cell. A second output (T35) of the second current memory cell is coupled to the integrator output (33).

17 Claims, 3 Drawing Sheets

SWITCHED CURRENT INTEGRATOR CIRCUIT

BACKGROUND OF THE INVENTION

This invention relates to an integrator circuit for integrating input signals having the form of sampled electrical currents, the integrator having an input means for receiving an input signal and an output for making available an output signal and comprising first and second current memory cells, means for connecting the output of the first current memory cell to the input of the second current memory cell, means for connecting a first output of the second current memory cell to the input of the first current memory cell, means for connecting the input means of the integrator to the input of the first and/or second current memory cell, and means for connecting a second output of the second current memory cell to the output of the integrator, wherein the first current memory cell is arranged to produce at its output during a first portion of each sampling period a current related to that applied to its input during a second portion of the preceding sample period and the second current memory cell is arranged to produce at its outputs during a second portion of each sampling period currents related to the current applied to its input during the first portion of the sampling period.

Such an integrator circuit has been disclosed in UK Patent Applications Nos. 8721758 (PHB33385), 8721759 (PHB33386), 8729987 (PHB33426), 8828666.1 (PHB33512), and 8828667.9 (PHB33514), which correspond to U.S. Pat. Nos. 4,864,217 (9/5/89), 4,866,368 (9/12/89), 4,897,596 (1/30/90), U.S. Pat. No. 5,021,692 (6/4/91), and U.S. application Ser. No. 446,821 (12/6/89), respectively, the contents of which are hereby incorporated by reference. Further, such an integrator circuit has been disclosed in a paper presented at the Institution of Electrical Engineers on 17th February, 1989 by J. B. Hughes, N. C. Bird, and I. C. Macbeth entitled "Switched Currents—A New Technique for Analogue Sampled Data Signal Processing". The integrator circuit is one of a number of modules which have been devised for use in circuits using the technique disclosed which has been called "switched current techniques" and the circuits using this technique have been called "switched current circuits" and will be referred to hereinafter by that name. As has been disclosed in the patent applications and paper referred to hereinbefore, switched current circuits have certain advantages over other sampled data processing circuits such as switched capacitor circuits, but are able to use many of the mathematical techniques used for the design of switched capacitor circuits.

In the design of continuous time active R.C. filters and switched capacitor filters a feed forward facility is often required in biquaratic and lossless ladder filter synthesis. This is easily achieved in active R.C. filters and also in switched capacitor filters where it can utilise non-switched capacitors. However, in switched current circuits there is no provision for accurately defined linear capacitors and hence such capacitive feedforward facilities cannot be provided.

SUMMARY OF THE INVENTION

It is an object of the invention to enable the provision of a facility for providing feedforward of signals through integrators in switched current circuits.

The invention provides an integrator circuit as set forth in the opening paragraph characterised in that the integrator circuit comprises a further input for receiving a further input signal, the further input being coupled to the input of the first current memory cell during at least the second portion of each sampling period and to the input of the second current memory cell during at least the first portion of each sampling period.

This enables a feedforward facility to be incorporated in switched current integrators so that biquadratic and lossless ladder filter synthesis can be achieved using switched current techniques. Consequently, direct mapping from active RC and switched capacitor circuit implementations to switched current circuit implementations become possible.

The further input may be coupled to the first current memory cell via a first switch which is closed only during the second portion of each sampling period and coupled to the second current memory cell via a second switch which is closed only during the first portion of each sampling period, the first and second portions being non-overlapping.

This enables a single feedforward current input to be provided and eliminates the requirement for two equal currents to be supplied to the feedforward input means. The current is supplied to the required parts of the integrator only at the times the integrator needs to act upon it.

The first and/or second current memory cells may comprise a current mirror circuit having an input branch comprising a diode connected field effect transistor and an output branch comprising a second field effect transistor, switching means connecting the gate electrodes of the diode connected and second field effect transistors, and voltage storage means associated with the second field effect transistor which maintains the current flow through the second field effect transistor when the switching means is open.

This provides a convenient means for storing a current and has the advantage that the output current can be made available virtually throughout a sampling period and can have any desired relationship with the input current by appropriately choosing the channel width/length ratios of the transistors. Another form of memory cell uses a single transistor both for measuring the input current and providing the output current. This has the advantage of eliminating device mismatch but cannot of course be used where the input and output currents are not equal and in addition the output current is not available while the input current is being sampled.

The input means may comprise first and second input terminals, the first input terminal being connected to the input of the first current memory cell and the second input terminal being connected to the input of the second current memory cell via switching means which is closed only during the first portion of each sampling period.

This enables the provision of a bilinear integrator having an additional feedforward input.

The integrator may comprise a first current source for providing a bias current to the input of the first current memory cell and a second current source providing a suitably scaled bias current for subtraction from the first and second outputs of the second current memory cell.

This enables a bi-directional input current to be processed while preventing the input diodes of the current memory cells from being reverse biassed. Thus, the integrator can accept and process bi-directional input currents and produce a bi-directional output current. In this way the integrator becomes a self contained module within a signal processing system and bias currents do not need to be passed between modules.

BRIEF DESCRIPTION OF THE DRAWINGS

Embodiments of the invention will now be described, by way of example, with reference to the accompanying drawings, in which.

DESCRIPTION OF THE PREFERRED EMBODIMENTS

Figure 1:
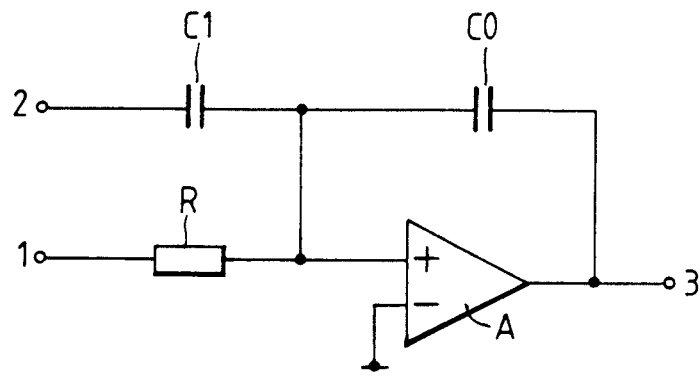
FIG. 1 shows a circuit diagram of a continuous time RC active integrator having a feedforward input.

FIG. 1 shows a known continuous time integrator having a signal feedforward connection. The integrator comprises a first input 1 which is connected via a resistor R to a non-inverting input of an amplifier A. A second input 2 is connected via a capacitor C1 to the non-inverting input of amplifier A while a capacitor C0 is connected between the output and the non-inverting input of amplifier A. The output of amplifier A is connected to an output terminal 3 while its inverting input is connected to ground. As is known to persons skilled in the art, the output voltage produced by the arrangement shown in FIG. 1 is given by $$V_0(s) = \frac{v_1(s)}{sRC0} - v_2(s)\frac{C1}{C0} \quad (1)$$

where $V_0(s)$ is the output voltage at terminal 3, $v_1(s)$ is the input voltage at terminal 1 and $v_2(s)$ is the input voltage at terminal 2. The first term corresponds to ideal integration of the input voltage $v_1$ while the second term corresponds to the feedforward of the input voltage $v_2$. This feedforward is accompanied by scaling of $v_2$ by the factor C1/C0 and by a signal inversion.

Figure 2:
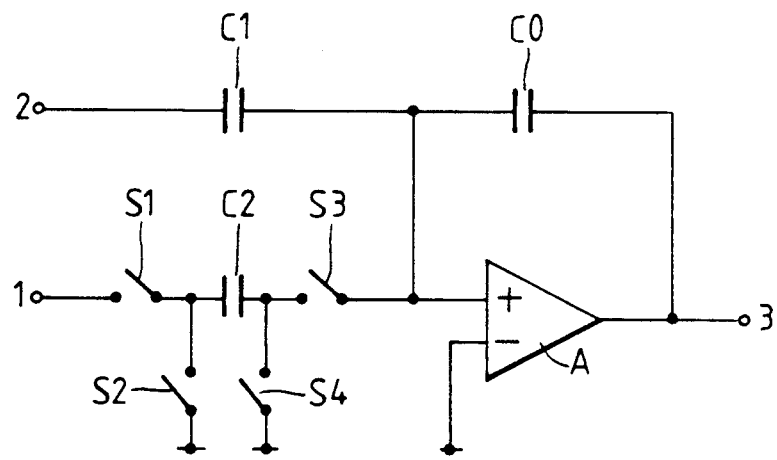
FIG. 2 shows a circuit diagram of a switched capacitor integrator having a feedforward input.

FIG. 2 shows a known switched capacitor circuit which performs the same function as the circuit shown in FIG. 1. The circuit shown in FIG. 2 effectively replaces the resistor R by the combination of a capacitor C2 and four switches S1 to S4. The switches S1 and S3 are closed during a first phase 01 of each sampling period while the switches S2 and S4 are closed during a second, non-overlapping, phase 02 of each sampling period. As is known to persons skilled in the art, the output voltage produced by the arrangement shown in FIG. 2 is given by $$V_0(z) = \frac{C2}{C0} \frac{1}{1-z^{-1}} v_1(z) - v_2(z)\frac{C1}{C0} \quad (2)$$

Again the first term corresponds to ideal integration of the input voltage $v_1$ while the second term corresponds to the feedforward of the input voltage $v_2$. This feedforward is accompanied by scaling of $v_2$ by the factor C1/C0 and by a signal inversion.

Such arrangements are used in biquadratic and lossless ladder filter synthesis to create transmission "zeros" in the transfer characteristic, for example, see page 283 of the textbook "Analog MOS Integrated Circuits for Signal Processing" by R. Gregorian and G. Temes.

Figure 3:
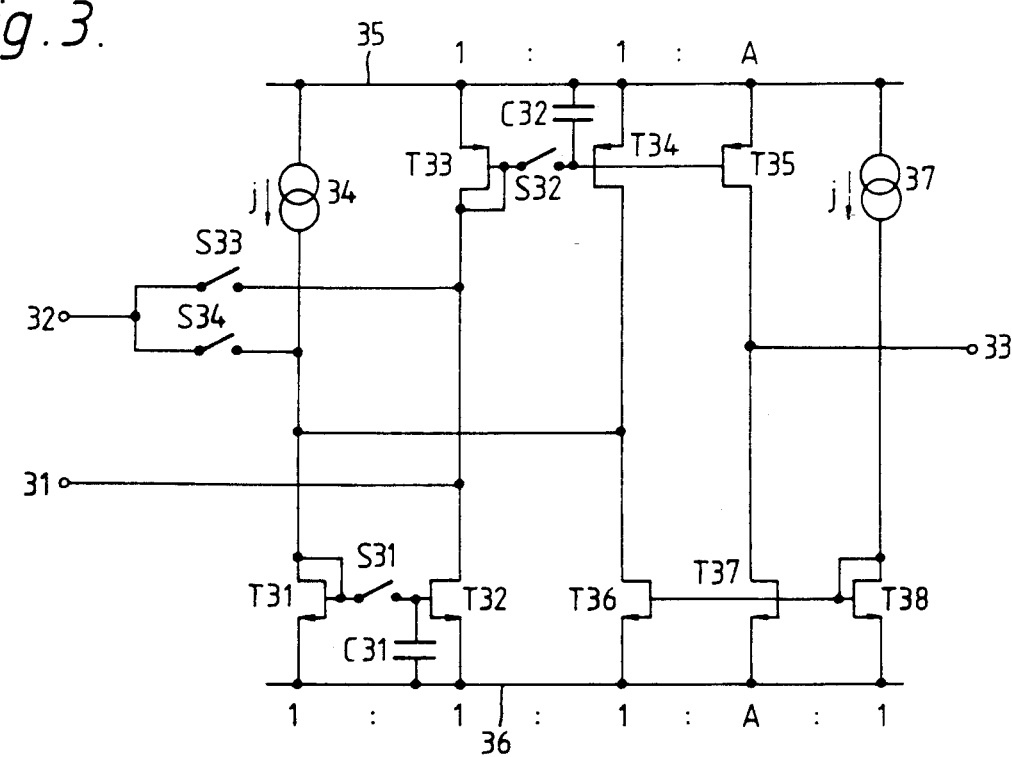
FIG. 3 shows a circuit diagram of a first embodiment of an integrator according to the invention.

FIG. 3 shows an arrangement for performing a signal feedforward function in a switched current integrator. The arrangement in FIG. 3 has a first input 31 which is connected to the junction of the drain electrode of an n-channel field effect transistor T32 and the drain and gate electrodes of a p-channel field effect transistor T33. A current source 34 is connected between a positive supply rail 35 and the drain and gate electrodes of an n-channel field effect transistor T31 whose source electrode is connected to a negative supply rail 36. The gate electrode of transistor T31 is connected via as switch S31 to the gate electrode of transistor T32. The gate electrode of transistor T33 is connected via a switch S32 to the gate electrodes of two further p-channel field effect transistors T34 and T35. The source electrodes of transistors T33, T34 and T35 are connected to the positive supply rail 35. A capacitor C31 (voltage storage means) is connected between the gate electrode of transistor T32 and the negative supply rail 36, while a capacitor C32 is connected between the gate electrode of transistor T34 and the positive supply rail 35. In practice the capacitors C31 and C32 may be formed by the inherent gate-source capacitance of transistors T32 and T34 rather than as separate entities.

The drain electrode of transistor T34 is connected to the drain electrode of transistor T31 and to the drain electrode of a further n-channel field effect transistor T36, while the drain electrode of transistor T35 is connected to an output terminal 33 and to the drain electrode of an n-channel field effect transistor T37. A current source 37 is connected between the positive supply rail 35 and the gate and drain electrodes of an n-channel field effect transistor T38. The gate electrode of transistor T38 is connected to the gate electrodes of transistors T36 and T37 while the source electrodes of transistors T32, T36, T37, and T38 are connected to the negative supply rail 36. A further input terminal 32 is connected via a switch S33 to the junction of the drain electrodes of transistors T33 and T32 and via a switch S34 to the drain electrode of transistor T31.

In FIG. 3 the transistors T31 and T32, the switch S31 and the capacitor C31 form a first current memory cell. Input terminal 31 forms the integrator input means to which a current i, to be integrated, is applied. Input terminal 32 forms the further input to which a signal B/A $i_2$ to be fed forward is applied. The second current memory cell is formed by transistors T33, T34 and T35, switch S32, and capacitor C32. The first output of the second current memory cell is taken from the drain electrode of transistor T34 which, for an ideal integrator, will have the same gate width/length ratio as that of transistor T33. If a lossy integrator is required then the gate width/length ratio of transistor T34 will be appropriately chosen so that the current produced at the drain electrode of transistor T34 is a desired fraction of that applied to transistor T33. The second output of the second current memory cell is taken from the drain electrode of transistor T35 whose gate width/length ratio is chosen to give a desired gain factor. Transistors T36, T37 and T38 form a current mirror circuit which is arranged to subtract appropriate bias currents from the first and second outputs of the second current memory cell so that only signal currents are fed to the integrator output 33 and to the input of the first current memory cell.

In operation, let it be assumed that a current $i_1$ is applied to input 31, a current $B/A\ i_2$ is applied to input 32 and an output current $i_0$ is produced at output 33. Let it also be assumed that the current sources 34 and 37 each produce a current j so that the input currents can be bi-directional without reverse biassing the input diodes of the current mirror and current memory circuits. Further, let it be assumed that the current ratios produced by the current mirror and current memory circuits are as indicated in FIG. 3 and that switches S32 and S33 are closed during a first phase 01 of each sampling period while switches S31 and S34 are closed during a second, non-overlapping, phase 02 of each sampling period. Then during phase 02 of sampling period n−1

$$I_2 = j + \frac{B}{A} i_2(n-1) + \frac{1}{A} i_0(n-1)$$

where $I_2$ is the current produced by transistor T32.

During phase 01 of sampling period n the current $I_3$ produced by transistor T34 is given by $$I_3 = I_2 - \frac{B}{A} i_2(n) - i_1(n)$$

Also $$\begin{aligned} i_0(n) &= (I_3 - j) A \\ &= A\left( \frac{B}{A} i_2(n-1) + \frac{1}{A} i_0(n-1) - \frac{B}{A} i_2(n) - i_1(n) \right) \\ &= i_0(n-1) - A\ i_1(n) - B(i_2(n) - i_2(n-1)) \end{aligned}$$

Transforming to the z domain $$i_0(z)(1 - z^{-1}) = -A\ i_1(z) - B\ i_2(z)(1 - z^{-1}) \quad (3)$$

$$i_0(z) = -\frac{A}{1 - z^{-1}} i_1(z) - B\ i_2(z)$$

Equation 3) maps directly onto equation 2) and consequently the first term corresponds to an ideal integration of the input current $i_1$ while the second term corresponds to the feedforward of the input current $i_2$. This feedforward is accompanied by scaling of $i_2$ by a factor B and by a signal inversion. As will be readily apparent to the person skilled in the art the integrator shown in FIG. 3 is a Backward Euler Integrator.

Figure 4:
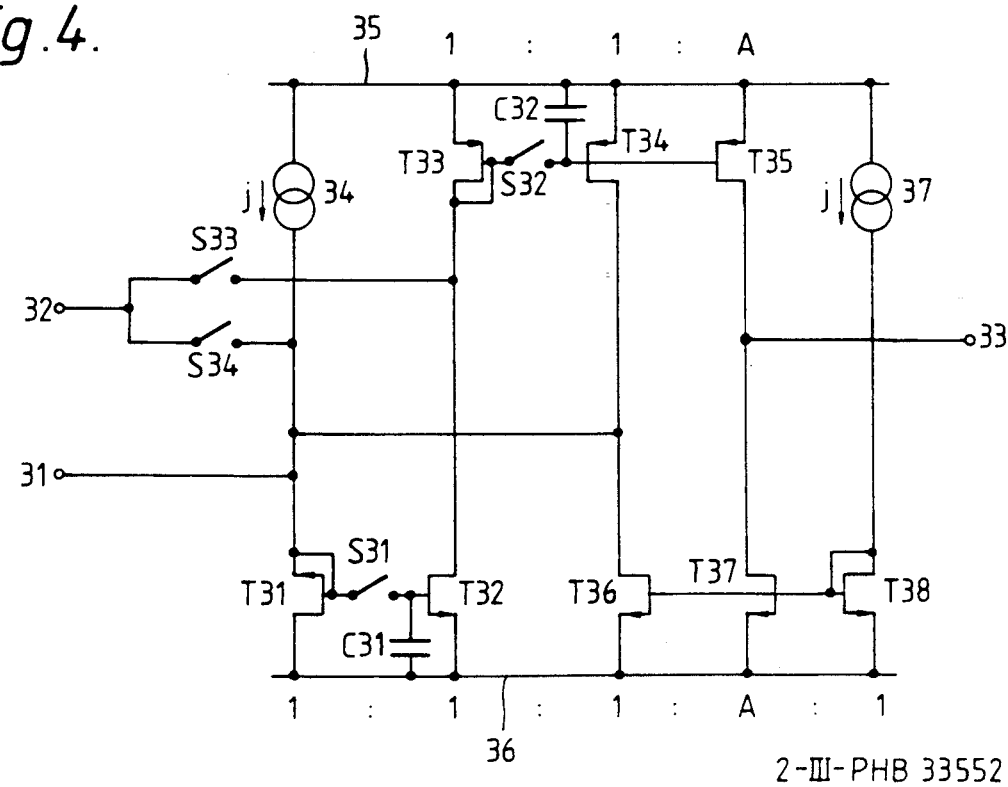
FIG. 4 shows a circuit diagram of a second embodiment of an integrator according to the invention.

The arrangement shown in FIG. 4 will give the transfer function between the input current $i_1$ applied to input 31 and the output current $i_0$ derived from output 33 of the Forward Euler Ideal Integrator. The arrangement differs from that shown in FIG. 3 in that the input 31 is connected to the junction of the current source 34 and the drain electrode of transistor T31 instead of to the junction of the drain electrodes of transistors T32 and T33. Using the same assumptions as with respect to the arrangement of FIG. 3, a similar analysis can be performed. During phase 02 of sampling period n−1 the current $I_2$ produced by transistor T32 is defined by the relationship $$I_2 = j + i_1(n-1) + \frac{1}{A} i_0(n-1) + \frac{B}{A} i_2(n-1)$$

During phase 01 of sampling period n the current $I_3$ produced by transistor T34 is defined by the relationship $$I_3 = I_2 - \frac{B}{A} i_2(n)$$

Also $$\begin{aligned} i_0(n) &= (I_3 - j) A. \\ &= A\left( i_1(n-1) + \frac{1}{A} i_0(n-1) + \frac{B}{A} i_2(n-1) - \frac{B}{A} i_2(n) \right) \\ &= i_0(n-1) + A\ i_1(n-1) - B(i_2(n) - i_2(n-1)) \end{aligned}$$

$$i_0(z) = A \cdot \frac{z^{-1}}{1 - z^{-1}} i_1(z) - B\ i_2(z)$$

It can be seen that the first term corresponds to a Forward Euler Ideal Integrator transfer function while the second term is a feedforward of the input current $i_2$ applied to input 32 scaled by the factor B and inverted.

Figure 5:
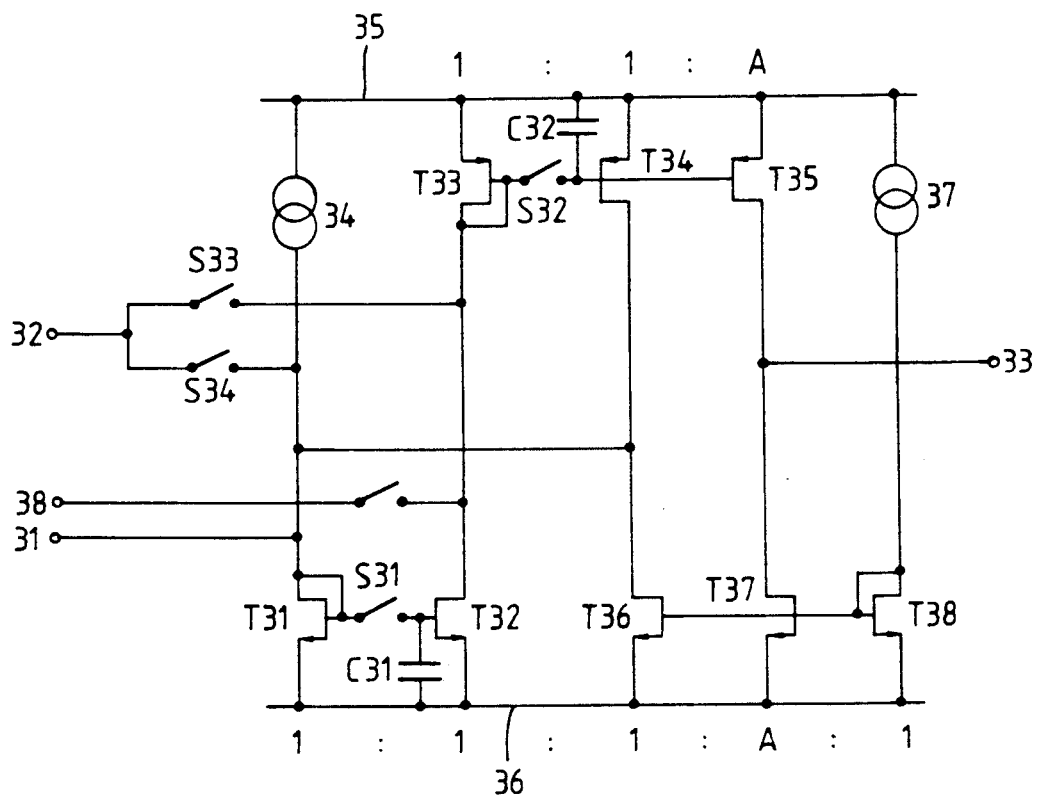
FIG. 5 shows a circuit diagram of a third embodiment of an integrator according to the invention.

FIG. 5 shows an arrangement for performing an Ideal Bilinear Integration function as well as feedforward from input 32. The difference between the arrangement shown in FIG. 4 and that shown in FIG. 5 is in the addition of a further input terminal 38 which is connected via a further switch S35 to the junction of the drain electrodes of transistors T32 and T33.

The operation of the arrangement can be analysed as follows on the assumption that switch S35 is closed during phase 01 and input 38 is supplied with the current $i_1$, and input 31 is supplied with the current $-i_1$.

During phase 02 of sampling period n−1 the current $I_2$ produced by transistor T32 is defined by the relationship $$I_2 = j - i_1(n-1) + \frac{1}{A} i_0(n-1) + \frac{B}{A} i_2(n-1)$$

During phase 01 of sampling period n the current $I_3$ produced by transistor T34 is defined by the relationship $$I_3 = I_2 - i_1(n) - \frac{B}{A} i_2(n)$$

Also $$\begin{aligned} i_0(n) &= A(I_3 - j) \\ &= A\left( -i_1(n-1) + \frac{B}{A} i_2(n-1) + \right. \\ &\quad \left. (n-1) - i_1(n) \frac{B}{A} i_2(n) \right) \end{aligned}$$

$$i_0(z) = -A\ i_1(z) \cdot \frac{1 + z^{-1}}{1 - z^{-1}} - B\ i_2(z)$$

It can be seen that the first term corresponds to an Ideal Bilinear Integrator transfer function while the second term is a feedforward of the input current $i_2$ applied to input 32 scaled by a factor B and inverted.

Various modifications can be made to the integrator circuits shown without departing from the scope of the invention. For example, if two currents $i_2$ are available then the input 32 could be split eliminating the need for the switches S33 and S34. Two currents could be derived, for example, from multiple outputs of a current mirror circuit in the stage providing the input current $i_2$. The technique could be applied to the fully differential versions of integrators described in one or more of the co-pending applications referred to hereinbefore and to the versions using only a one polarity device for conducting signal currents. Also, versions of integrators using current conveyors are equally applicable to this invention. Other types of current memory cell may be used in appropriate designs of an integrator, for example, that shown in FIGS. 7 to 9 of U.S. Pat. No. 4,958,123 (9/18/90).

It should be noted that the current memory cells and current mirror circuits shown have been disclosed in their simplest basic form. If better performance is required a number of enhancements can be employed. This includes using cascoded current mirrors or current memories, using source degeneration resistors, using dynamic element matching, and using current conveyors or current conveyor type current memory cells, particularly where current summing occurs at an input. These techniques are disclosed in one or more of our co-pending UK applications mentioned above, an in UK applications 8828668.7 (PHB33513), 8903705.5 (PHB33532), and 8903704.8 (PHB33533), the contents of which are hereby incorporated by reference. The UK application PHB33,532 corresponds to U.S. application Ser. No. 479,304 (2/13/90) and UK applications PHB 33,513 and PHB 33,533 correspond to U.S. Pat. Nos. 5,028,822 (7/2/91 ) and 5,012,133 (4/30/91), respectively.

From reading the present disclosure, other modifications will be apparent to persons skilled in the art. Such modifications may involve other features which are already known in the design and use of electrical or electronic circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any variation of one or more of those features which would be obvious to persons skilled in the art, whether or not it relates to the same invention as presently claimed in any claim and whether or not it mitigates any or all of the same technical problems as does the present invention.

I claim:

1. An integrator circuit for integrating input signals having the form of sampled electrical currents comprising: input means for receiving an input signal and an output for making available an output signal, first and second current memory cells, means for connecting an output of the first current memory cell to an input of the second current memory cell, means for connecting a first output of the second current memory cell to an input of the first current memory cell, means for connecting the input means of the integrator circuit to the input of at least one of the first and second current memory cells, and means for connecting a second output of the second current memory cell to the output of the integrator circuit, wherein the first current memory cell is arranged to produce at its output during a first portion of each sampling period a current related to its input current during a second portion of a preceding sample period and the second current memory cell produces at its outputs during a second portion of each sampling period currents related to the current applied to its input during the first portion of the sampling period, wherein the integrator circuit comprises a further input for receiving a further input signal, the further input being coupled to the input of the first current memory cell during at least the second portion of each sampling period and to the input of the second current memory cell during at least the first portion of each sampling period.

2. An integrator circuit as claimed in claim 1, wherein the further input is coupled to the first current memory cell via a first switch which is closed only during the second portion of each sampling period and is coupled to the second current memory cell via a second switch which is closed only during the first portion of each sampling period, the first and second portions being non-overlapping.

3. An integrator circuit as claimed in claim 2, wherein at least one of the first and second current memory cells comprise a current mirror circuit, said current mirror circuit having an input branch comprising a diode connected field effect transistor and an output branch comprising a second field effect transistor, switching means connecting the gate electrodes of the diode connected transistor and the second field effect transistor, and voltage storage means coupled to the second field effect transistor for maintaining a current flow through the second field effect transistor when the switching means is open.

4. An integrator circuit as claimed in claim 3, wherein the input means comprises first and second input terminals, the first input terminal being connected to the input of the first current memory cell and the second input terminal being connected to the input of the second current memory cell via switching means which is closed only during the first portion of each sampling period.

5. An integrator circuit as claimed in claim 1, comprising a first current source connected to provide a bias current to the input of the first current memory cell and a second current source connected to provide suitably scaled bias currents to be subtracted from the first and second outputs of the second current memory cell.

6. An integrator circuit as claimed in claim 1, wherein at least one of the first and second current memory cells comprise a current mirror circuit, said current mirror circuit having an input branch comprising a diode connected field effect transistor and an output branch comprising a second field effect transistor, switching means connecting the gate electrodes of the diode connected transistor and the second field effect transistor, and voltage storage means coupled to the second field effect transistor for maintaining a current flow through the second field effect transistor when the switching means is open.

7. An integrator circuit as claimed in claim 6, wherein the input means comprise first and second input terminals, the first input terminal being connected to the input of the first current memory cell and the second input terminal being connected to the input of the second current memory cell via switching means which is closed only during the first portion of each sampling period.

8. An integrator circuit as claimed in claim 1, wherein the input means comprise first and second input terminals, the first input terminal being connected to the input of the first current memory cell and the second input terminal being connected to the input of the second current memory cell via switching means which is closed only during the first portion of each sampling period.

9. An integrator circuit as claimed in claim 2, wherein the input means comprise first and second input terminals, the first input terminal being connected to the input of the first current memory cell and the second input terminal being connected to the input of the second current memory cell via switching means which is closed only during the first portion of each sampling period.

10. An integrator circuit as claimed in claim 2, comprising a first current source connected in the integrator circuit so as to provide a bias current to the input of the first current memory cell and a second current source connected in the integrator circuit so as to provide suitably scaled bias currents to be subtracted from the first and second outputs of the second current memory cell.

11. An integrator circuit as claimed in claim 6, comprising a first current source connected in the integrator circuit so as to provide a bias current to the input of the first current memory cell and a second current source connected in the integrator circuit so as to provide suitably scaled bias currents to be subtracted from the first and second outputs of the second current memory cell.

12. An integrator circuit as claimed in claim 8, comprising a first current source connected in the integrator circuit so as to provide a bias current to the input of the first current memory cell and a second current source connected in the integrator circuit so as to provide suitably scaled bias currents to be subtracted from the first and second outputs of the second current memory cell.

13. An integrator circuit for integrating sampled input signal currents comprising:
  a first current input for receiving a sampled input signal current to be integrated,
  a current output for the integrated output current,
  first and second current memory cells each including an input and an output,
  means coupling the output of the first current memory cell to the input of the second current memory cell,
  means coupling said output of the second current memory cell to the input of the first current memory cell,
  means coupling a second output of the second current memory cell to said current output,
  means coupling the first current input to the input of at least one of said first and second current memory cells,
  a further current input for receiving a further input signal current, and
  switching means coupled to said first and second current memory cells and operated by non-overlapping timing signals whereby the first current memory cell produces at its output during a first portion of a sampling period a current related to its input current during a second portion of a preceding sample period and the second memory cell produces at its outputs during a second portion of a sampling period currents related to its input current during the first portion of the sampling period, and whereby the further input is coupled to the input of the first current memory cell during at least the second portion of a sampling period and to the input of the second current memory cell during at least the first portion of a sampling period.

14. An integrator circuit as claimed in claim 13 wherein said switching means comprise:
  first and second switches coupling said further current input to the inputs of the first and second current memory cells, respectively, said first switch being closed only during the second portion of a sampling period and the second switch being closed only during the first portion of a sampling period, and wherein said timing signals are operative so that the first and second portions of a sampling period are non-overlapping.

15. An integrator circuit as claimed in claim 14 wherein at least one of said current memory cells comprise a current mirror circuit having an input branch including a diode-connected field effect transistor and an output branch including a second field effect transistor, said switching means including a third switch coupling the gate electrodes of the diode connected and second field effect transistors and operated by said timing signals in synchronism with a respective one of said first and second switches, and a capacitor coupled to the gate electrode of the second field effect transistor.

16. An integrator circuit as claimed in claim 14, further comprising:
  a second current input for receiving a second sampled input signal current,
  said first current input being coupled to the input of the first current memory cell, and
  said switching means further comprise a third switch coupling the second current input to the input of the second current memory cell and operated by said timing signals to be closed only during said first portion of a sampling period.

17. An integrator circuit as claimed in claim 16, wherein at least one of said current memory cells comprise a current mirror circuit having an input branch including a diode-connected field effect transistor and an output branch including a second field effect transistor, said switching means including a fourth switch coupling the gate electrodes of the diode-connected and second field effect transistors and operated by said timing signals in synchronism with a respective one of said first and second switches, and a capacitor coupled to the gate electrode of the second field effect transistor.

* * * * *